(12) United States Patent
Zhang et al.

(10) Patent No.: US 9,349,862 B2
(45) Date of Patent: May 24, 2016

(54) METHOD OF FABRICATING SEMICONDUCTOR DEVICES

(75) Inventors: Yiying Zhang, Beijing (CN); Qiyang He, Beijing (CN)

(73) Assignee: SEMICONDUCTOR MANUFACTURING INTERNATIONAL (BEIJING) CORPORATION (CN)

( * ) Notice: Subject to any disclaimer, the term of this patent is extended or adjusted under 35 U.S.C. 154(b) by 0 days.

(21) Appl. No.: 13/293,001

(22) Filed: Nov. 9, 2011

(65) Prior Publication Data

US 2012/0309150 A1  Dec. 6, 2012

(30) Foreign Application Priority Data

Jun. 2, 2011  (CN) .......................... 2011 1 0147173

(51) Int. Cl.
| | | |
|---|---|---|
| H01L 21/336 | (2006.01) |
| H01L 21/469 | (2006.01) |
| H01L 29/78 | (2006.01) |
| H01L 21/265 | (2006.01) |
| H01L 21/8234 | (2006.01) |
| H01L 21/8238 | (2006.01) |
| H01L 29/165 | (2006.01) |
| H01L 29/66 | (2006.01) |
| H01L 21/306 | (2006.01) |
| H01L 21/308 | (2006.01) |

(52) U.S. Cl.
CPC ...... *H01L 29/7848* (2013.01); *H01L 21/26506* (2013.01); *H01L 21/3086* (2013.01); *H01L 21/30604* (2013.01); *H01L 21/30608* (2013.01); *H01L 21/823412* (2013.01); *H01L 21/823425* (2013.01); *H01L 21/823807* (2013.01); *H01L 21/823814* (2013.01); *H01L 29/165* (2013.01); *H01L 29/66575* (2013.01); *H01L 29/66636* (2013.01); *H01L 29/78* (2013.01)

(58) Field of Classification Search
USPC ......... 438/285, 278, 199, 198, 298, 303, 308, 438/759, 766
See application file for complete search history.

(56) References Cited

U.S. PATENT DOCUMENTS

| | | | | |
|---|---|---|---|---|
| 6,030,863 | A  * | 2/2000 | Chang et al. | 438/229 |
| 6,426,254 | B2 * | 7/2002 | Kudelka et al. | 438/246 |
| 7,303,999 | B1 * | 12/2007 | Sriraman et al. | 438/719 |
| 2005/0142768 | A1 * | 6/2005 | Lindert et al. | 438/285 |
| 2005/0148147 | A1 * | 7/2005 | Keating et al. | 438/299 |
| 2006/0131689 | A1 * | 6/2006 | Tsukidate | 257/506 |

(Continued)

FOREIGN PATENT DOCUMENTS

CN  1399319 A  2/2003

*Primary Examiner* — Marc Armand
*Assistant Examiner* — Wilner Jean Baptiste
(74) *Attorney, Agent, or Firm* — Innovation Counsel LLP

(57) ABSTRACT

A method of fabricating a semiconductor device is provided. The method includes forming a gate having a first material on a substrate and a layer of a second material overlaying the gate. Sidewall spacers are formed on opposite sides of the gate. A characteristic of a portion of the substrate between adjacent sidewall spacers is changed using the layer of second material and the sidewall spacers as a mask. An isotropic wet etch process is performed to remove the substrate portion with a changed characteristic to form a recess in the substrate. An orientation selective wet etching process is performed on the recess to shape the inner walls of the recess into sigma-shape. Changing a substrate characteristic in conjunction with isotropic wet etching prevents the substrate from being damaged, and therefore can obtain defect free epitaxial SiGe growth performance.

13 Claims, 5 Drawing Sheets

(56) References Cited

U.S. PATENT DOCUMENTS

| | | | |
|---|---|---|---|
| 2007/0224767 A1* | 9/2007 | Lin et al. | 438/301 |
| 2008/0237742 A1 | 10/2008 | Ranade et al. | |
| 2008/0242037 A1 | 10/2008 | Sell et al. | |
| 2009/0035911 A1 | 2/2009 | Rachmady et al. | |
| 2009/0152599 A1* | 6/2009 | Gao | H01L 21/823807 257/288 |
| 2010/0075476 A1 | 3/2010 | Miyashita | |
| 2010/0295127 A1 | 11/2010 | Cheng et al. | |
| 2011/0316046 A1* | 12/2011 | Chan et al. | 257/192 |
| 2012/0021583 A1* | 1/2012 | Wu | H01L 21/30608 438/300 |
| 2012/0132957 A1* | 5/2012 | Sung et al. | 257/192 |
| 2012/0267683 A1* | 10/2012 | Kronholz et al. | 257/192 |
| 2013/0117661 A1* | 5/2013 | De Jesus et al. | 715/234 |

\* cited by examiner poor seed growth

METHOD OF FABRICATING SEMICONDUCTOR DEVICES

CROSS-REFERENCES TO RELATED APPLICATIONS

This application claims priority to Chinese Patent Application No. 201110147173.2, filed on Jun. 2, 2011 and entitled "Method of Fabricating Semiconductor Devices", which is incorporated herein by reference in its entirety. This application is related to commonly assigned U.S. patent application Ser. No. 13/293,030, filed Nov. 9, 2011, and commonly assigned U.S. patent application Ser. No. 13/293,052, filed Nov. 9, 2011, the contents of all of which are incorporated herein by reference in their entirety.

BACKGROUND

1. Field of the Invention

The present disclosure relates to a method of fabricating semiconductor devices, and particularly to a method of fabricating semiconductor devices including PMOS devices having embedded SiGe (eSiGe).

2. Description of the Related Art

In order to meet the demand of users for low profile electronics, in enhanced Very Large Scale Integration (VLSI) processes, stress engineering has been used to improve the performance of devices. One of the effective ways to increase hole mobility in the channel region of a PMOS device is by embedding SiGe (eSiGe) structures. In sigma-shaped (Σ-shaped) eSiGe structures, a specially shaped recess is formed and refilled with SiGe forming source and drain regions to increase stress in the channel region since the lattice constant of SiGe is larger than that of Si and the distance between source and drain regions is reduced by using the Σ-shaped SiGe.

A prior art method of forming Σ-shaped SiGe in a PMOS device is shown in FIG. 1A to FIG. 1D. After forming on a Si substrate a gate and sidewall spacers on opposite sides of the gate (FIG. 1A), a recess is formed between adjacent sidewall spacers in the Si substrate by dry etching, as shown in FIG. 1B. The section of the recess shown in FIG. 1B is a substantial rectangle with a planar bottom, which is defined by four vertices A, B, C and D.

Next, as shown in FIG. 1C, the rectangular recess is wet etched in an orientation selective manner to be expanded into Σ-shape. Commonly, orientation selective wet etching is faster on (100) crystal orientation planes than on (111) crystal orientation planes. In fact, orientation selective wet etching substantially stops on (111) crystal orientation planes. As a result, two vertices C and D formed after the dry etching shown in FIG. 1B remain as etch stop points of (111) crystal orientation planes. Finally, as shown in FIG. 1D, SiGe is epitaxially grown in the resulting Σ-shaped recess, so as to form SiGe source and drain regions.

However, conventional method of forming Σ-shaped SiGe suffer from the problem of difficult SiGe epitaxial growth. Specifically, in the dry etching process performed on the substrate shown in FIG. 1B, defects such as Si lattice mismatch or the like can occur at the edges of the formed rectangular recess, particularly at the vertices C and D shown in FIG. 1B, due to plasma bombardment. As mentioned above, as a result of orientation selective wet etching, the vertices C and D will not etch as they are (111) crystal orientation etch stop points. In the subsequent SiGe epitaxial growth, the seed layer is very sensitive to Si surface conditions, such as cleanness and Si lattice condition. Defects such as Si lattice mismatch can lead to the difficulty in the epitaxial growth of a seed layer. Hence, as shown in FIG. 1E, Si lattice defects at points C and D will make the subsequent defect free epitaxial growth of a SiGe seed layer difficult to achieve.

SUMMARY

The present disclosure relates to a method of fabricating semiconductor devices, and particularly to a method of fabricating semiconductor devices including PMOS devices having embedded SiGe (eSiGe).

According to one embodiment of the present invention, a method of fabricating a semiconductor device includes forming a gate having a first material on a substrate and forming a layer of a second material overlaying the gate. The method of fabricating a semiconductor device further includes forming sidewall spacers on opposite sides of the gate. The method of fabricating a semiconductor device further includes changing a characteristic of a portion of the substrate adjacent the sidewall spacers using the layer of second material and the sidewall spacers as a mask. The method of fabricating a semiconductor device further includes performing an isotropic wet etching process to remove the substrate portion with the changed characteristic to form a recess in the substrate, the recess having an inner wall, and performing an orientation selective wet etching process on the recess to shape the inner wall of the recess so as to cause the inner wall of the recess to be sigma-shaped.

According to one specific embodiment, the step of changing a characteristic includes performing an ion implantation process on the substrate. According to another specific embodiment, the ion implantation process includes implanting into the substrate any one or more ion. The ion is arsenic, boron, germanium, or carbon. According to another specific embodiment, the step of performing ion implantation process on the substrate includes performing pre-amorphization implantation (PAI) of germanium or carbon ions into the substrate with an implantation dosage of $10^{13}$ to $10^{15}$ atoms/cm$^2$ at an implantation energy of less than 100 keV.

According to another specific embodiment, the second material is silicon nitride. According to another specific embodiment, a thickness of the layer of second material is selected depending on parameters including the material of the second material, an ion to be implanted, and an implantation energy. According to another specific embodiment, if arsenic ion is implanted and the second material is $Si_3N_4$, the thickness of the layer of second material and the implantation energy satisfies a relationship of Thk=4.2X+25.5, where Thk is the thickness of the layer of second material in units of Å and X is the implantation energy of arsenic ion in units of keV.

According to another specific embodiment, the step of changing the characteristic includes performing an oxidation process on the substrate. According to another specific embodiment, the oxidation process includes a wet oxidation process. According to another specific embodiment, the step of performing an orientation selective wet etching process on the recess includes using tetramethylammonium hydroxide (TMAH). According to another specific embodiment, the etching rate of the orientation selective wet etching on a (100) crystal orientation plane is faster than that on a (111) crystal orientation plane. According to another specific embodiment, the orientation selective wet etching substantially stops on the (111) crystal orientation of plane. According to another specific embodiment, the first material is polysilicon.

According to another specific embodiment, the method of fabricating a semiconductor device further includes, performing epitaxial growth of SiGe in the sigma-shaped recess after the orientation selective wet etching process. According to another specific embodiment, the method of fabricating a semiconductor device further includes, performing an ion implantation process on the substrate to form a source region and a drain region before the changing a characteristic of the portion of the substrate process. According to another specific embodiment, the method of fabricating a semiconductor device further includes, performing an ion implantation process on the substrate to form a source region and a drain region after the epitaxial growth of SiGe is performed in the sigma-shaped recess. According to another specific embodiment, the depth of the recess is about 300 Å to 500 Å before the orientation selective wet etching process is performed on the recess.

According to another specific embodiment, the method of fabricating a semiconductor device further includes, before changing the characteristic of a portion of the substrate process, forming a mask overlaying an area to be formed as a NMOS device and exposing an area to be formed as a PMOS device. According to another specific embodiment, the second material is silicon nitride. According to another specific embodiment, the etching rate of the orientation selective wet etching on a (100) crystal orientation plane is faster than that on a (111) crystal orientation plane.

A better understanding of the nature and advantages of the embodiments of the present invention may be gained with reference to the following detailed description and the accompanying drawings.

BRIEF DESCRIPTION OF THE DRAWINGS

FIGS. 1A to 1D show a prior art method of forming Σ-shaped SiGe in a PMOS device, wherein FIG. 1A shows forming gate on a substrate, and sidewall spacers on opposite sides of gate; FIG. 1B shows performing dry etching to form a recess having a substantially rectangular section in the substrate between adjacent sidewall spacers; FIG. 1C shows performing orientation selective wet etching on the rectangular recess to expand it into Σ shape; and FIG. 1D shows epitaxially growing SiGe in the Σ-shaped recess to form SiGe source and drain regions.

FIG. 3A shows forming a gate on a substrate, in accordance with an embodiment of the present invention.

FIG. 3B shows changing a characteristic of a portion of the substrate, in accordance with an embodiment of the present invention.

FIG. 3C shows removing the substrate portion having the changed characteristic by isotropic wet etching to form a substantially rectangular recess, in accordance with an embodiment of the present invention.

FIG. 3D shows performing an orientation selective wet etching process on the substantially rectangular recess to expand the recess into Σ shape, in accordance with an embodiment of the present invention.

DETAILED DESCRIPTION

According to embodiments of the present invention, a method for fabricating semiconductor devices including PMOS devices having embedded SiGe (eSiGe) is provided. In an embodiment of this disclosure, instead of using dry etching which may damage the lattice structure of the substrate, first, a characteristic of predetermined portion of the substrate is changed by a process such as ion implantation or oxidation; next, the substrate portion with the changed characteristic is removed by isotropic wet etching to form a substantially rectangular recess in the substrate; then, the inner walls of the recess are shaped into sigma-shape (Σ-shape) by orientation selective wet etching. The sigma-shaped recess is then epitaxially filled in with SiGe. Thus, the substrate is prevented from being damaged and adverse effects on the subsequent epitaxial growth of SiGe are avoided.

Figure 1A:
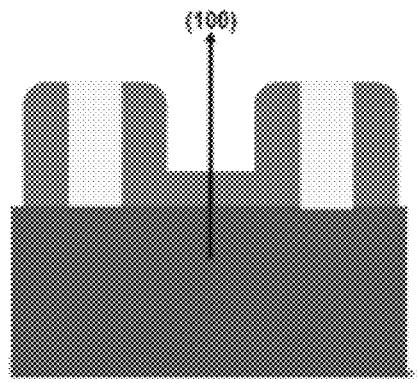
Figure 1B:
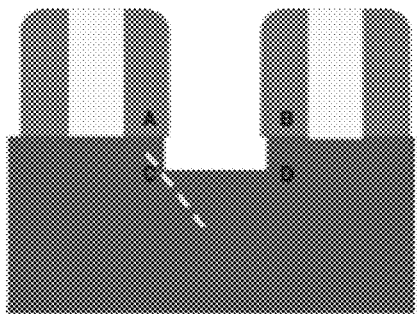
Figure 1C:
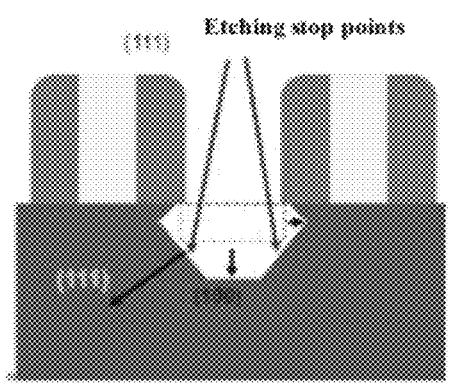
Figure 1D:
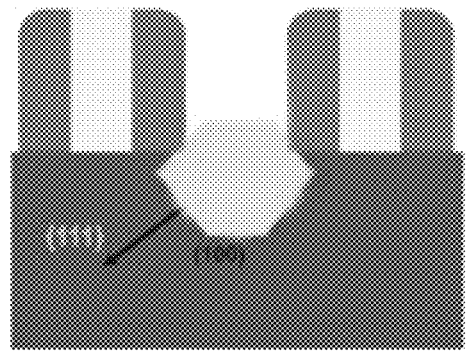
Figure 1E:
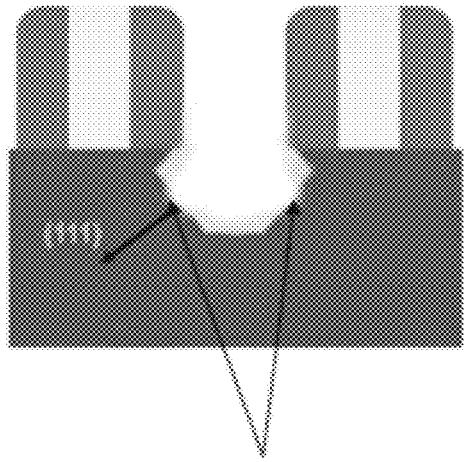
FIG. 1E shows the defects of the prior art method illustrated in FIG. 1A to FIG. 1D.
Figure 2:
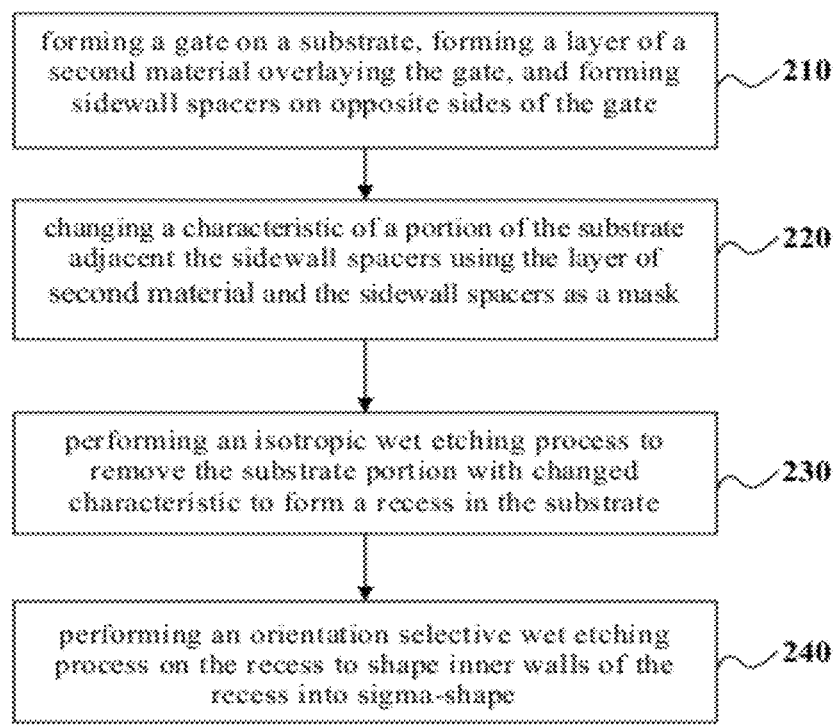
FIG. 2 schematically shows a flowchart of a method of forming Σ-shaped recess in a PMOS device, in accordance with an embodiment of the present invention.

FIG. 2 schematically shows a flowchart of a method of forming a Σ-shaped recess in a PMOS device, in accordance with an embodiment of the present invention. FIG. 3A to FIG. 3D show simplified cross-section views of various steps of the method of forming the Σ-shaped recess in FIG. 2, in accordance with embodiments of the present invention.

Figure 3A:
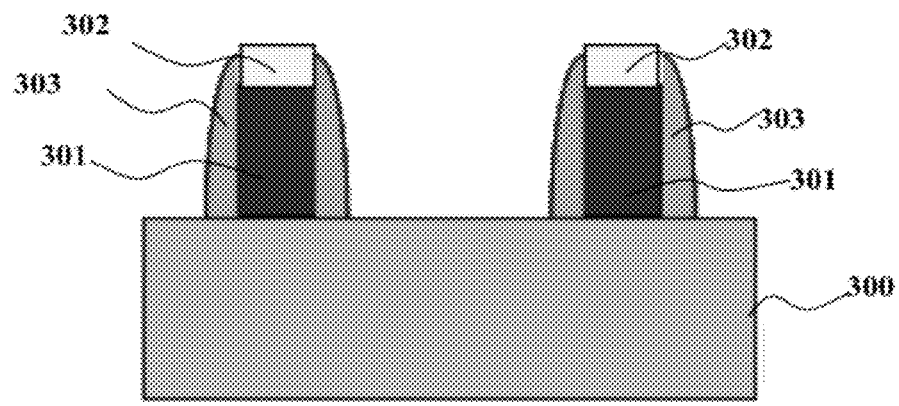
FIG. 3A to FIG. 3D show simplified cross-section views of various steps of the method of forming the Σ-shaped recess in FIG. 2, in accordance with embodiments of the present invention.

First, at step 210 in FIG. 2, a substrate is provided, on which gates are formed on the substrate. FIG. 3A shows forming a gate 301 having a first material on a substrate 300 and a layer of second material 302 overlaying gate 301, in accordance with an embodiment of the present invention. The gate may include a dielectric layer overlying the substrate and a gate overlying the dielectric layer. The dielectric layer may be a silicon dioxide layer. Sidewall spacers 303 are formed on opposite sides of gate 301. The substrate can be made of Si. Here, the first material of the gates can be, for example, polysilicon. Layer of second material 302 and sidewall spacers 303 are used to protect gate 301 in subsequent dry etching, wet etching, oxidation and source/drain ion-implantation processes. The second material may be, for example, silicon nitride. Sidewall spacers 303 may be, for example, silicon nitride or silicon oxide. Gate 301, layer of second material 302, and sidewall spacers 303 can be formed by use of any processes well known by those skilled in the art, descriptions of which are omitted for the purpose of simplicity.

Figure 3B:
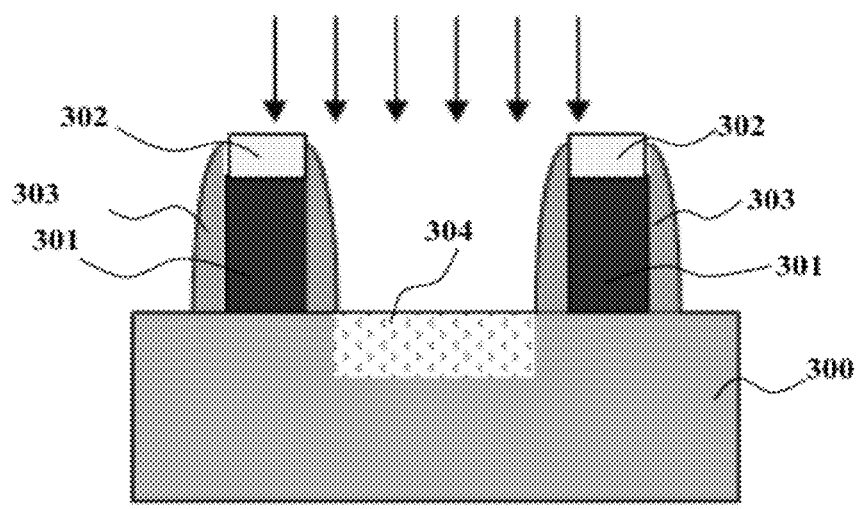

Next, at step 220 in FIG. 2 and FIG. 3B show changing a characteristic of a predetermined portion 304 of the substrate, in accordance with an embodiment of the present invention. A characteristic of the portion of the substrate is changed adjacent the sidewall spacers between two adjacent gates using the layer of second material and the sidewall spacers as a mask. Predetermined portion 304 of the substrate 300 between adjacent sidewall spacers 303 is changed in substance characteristic. For instance, the silicon in predetermined substrate portion 304 is changed into an amorphous state.

In some embodiments, changing the characteristic of the predetermined portion 304 can be implemented by implanting ions into substrate 300. For example, any one or more of arsenic, boron, germanium, or carbon ions can be implanted into substrate 300. In one example, the pre-amorphization implantation (PAI) of germanium or carbon ions can be performed on substrate 300, with an implantation dosage of $10^{13}$ to $10^{15}$ atoms/cm$^2$ at implantation energy of less then 100 keV.

It should be noted that, although it is described by way of example to implant into the substrate arsenic, boron, germanium, or carbon ions, those skilled in the art will appreciate that other ions can also be implanted, so long as they can change the substance characteristic of the substrate portion to subsequently facilitate the removal of predetermined portion 304. Likely, although the pre-amorphization implantation process is described above as an example, other implantation processes are also possible, for example, cluster ion implantation process.

When implanting ions into the substrate 300, it is necessary to ensure a sufficient thickness of layer of second material 302 to prevent the first material of gate 301 from being affected by the ion implantation. Commonly, the thickness of layer of second material 302 is selected depending on parameters including the material of the second material, ions to be implanted, and implantation energy. In one example, when arsenic ion is implanted and the second material is $Si_3N_4$, the thickness of layer of second material 302 and the implantation energy satisfies a relationship of $$Thk=4.2X+25.5 \tag{Eq.1}$$

where Thk is the thickness of layer of second material 302 in units of Å, and X is the implantation energy of arsenic ion in units of keV.

In addition to ion implantation, in other embodiments, it is also possible to change the substance characteristic for predetermined portion 304 by an oxidation process. Any of the oxidation processes that are well known by those skilled in the art can be adopted, including thermal oxidation, plasma oxidation, and wet oxidation is preferable. In one example, predetermined portion 304 of substrate 300 is oxidized at a temperature ranging from about 700° C. to about 1200° C.

Figure 3C:
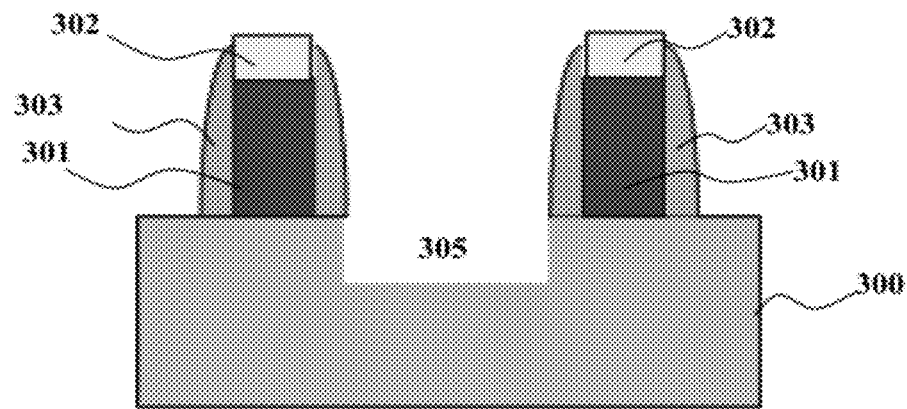

Next, at step 230 in FIG. 2 and FIG. 3C show removing the substrate portion having the changed characteristic by isotropic wet etching to form a substantially rectangular recess 305, in accordance with an embodiment of the present invention. Substrate portion 304 having characteristic changed is removed by isotropic wet etching to form recess 305 in the substrate. Here, recess 305 can be formed by a wet etching process having a high selectivity ratio with respect to substrate portion 304 for which the characteristic has been changed and other substrate portions for which the characteristic have not been changed. In one embodiment, in the case that the substrate portion 304 is changed into silicon oxide by the oxidation process at step 220 in FIG. 2, the substrate portion 304 can be removed with a HF solution. For example, the wet etching process mentioned above can be performed using a solution of $H_2O$ and HF in a mass proportion of 100:1 or 50:1 at a temperature of 23±0.5° C. In one example, the depth H of the recess 305 can be, for example, about 300 Å to about 500 Å.

Figure 3D:
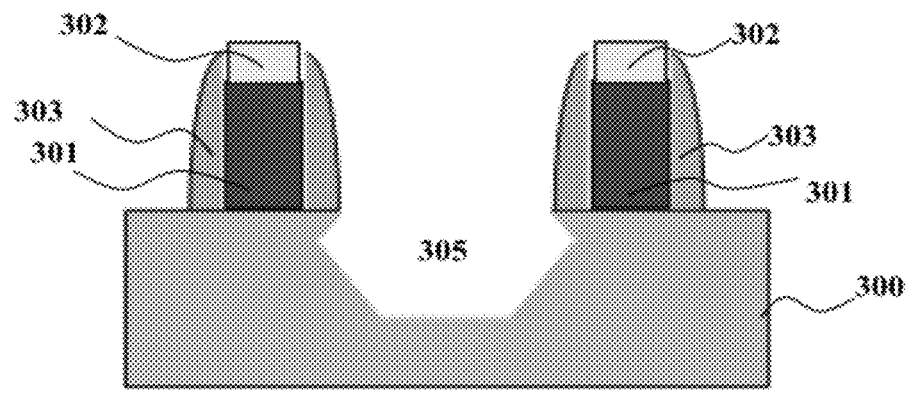

Finally, at step 240 in FIG. 2 and FIG. 3D show performing an orientation selective wet etching process on the substantially rectangular recess to expand the recess into Σ shape, in accordance with an embodiment of the present invention. Orientation selective wet etching is performed on recess 305 to shape the inner walls of recess 305 into sigma-shape (Σ form). In one embodiment, an orientation selective wet etching process that is faster on (100) crystal orientation planes than on (111) crystal orientation planes may be used. For example, tetramethylammonium hydroxide (TMAH) with mass concentration of 10% to 25% can be used for etching at a temperature of 70° C. to 90° C. In such case, the etching substantially stops on (111) crystal orientation planes.

It should be noted that before changing the characteristic of a portion of the substrate between adjacent sidewall spacers (i.e., before step 220 in FIG. 2) or after the orientation selective wet etching on the recess (i.e., after step 240 in FIG. 2), ion implantation can be performed on the substrate to form source and drain regions.

As mentioned above, by substituting dry etching with a process capable of changing the substrate characteristic in conjunction with isotropic wet etching, the substrate may be prevented from being damaged, and therefore may obtain good defect free epitaxial growth performance.

It should be noted that, eSiGe structures functioning as source/drain regions generally work in PMOS transistors. Thereby, with respect to semiconductor devices having both PMOS and NMOS transistors, it is necessary to shield the portions with NMOS transistors with a mask, or the like, during the formation of the PMOS transistors into Σ shape.

Embodiments of the present invention provide an apparatus and a method for fabricating MOS devices. It will be apparent to those with skill in the art that modifications to the above methods and apparatuses may occur without deviating from the scope of the present invention. The embodiments of the present invention are not limited by the type of transistor, PMOS, NMOS or otherwise, used to fabricating MOS devices. The embodiments of the present invention are not limited by the type of integrated circuit in which the present invention may be disposed. Nor are the embodiments of the present invention limited to any specific type of process technology, e.g., CMOS, Bipolar, or BICMOS that may be used to manufacture MOS devices. Accordingly, the disclosures and descriptions herein are intended to be illustrative, but not limiting, of the scope of the invention, which is set forth in the following claims along with their full scope of equivalents.

What is claimed is:

1. A method of fabricating a semiconductor device comprising:
    forming a gate having a first material on a substrate;
    forming a layer of a second material overlaying the gate;
    forming sidewall spacers on opposite sides of the gate;
    changing a characteristic of a first portion of the substrate adjacent to the sidewall spacers using the layer of the second material and the sidewall spacers as a mask, wherein changing the characteristic of the first portion of the substrate includes performing an oxidation process on the first portion of the substrate so as to facilitate removal of the oxidized first portion of the substrate;
    performing an isotropic wet etching process to remove the oxidized first portion of the substrate to form a substantially rectangular recess in the substrate, the rectangular recess having an inner wall; and
    performing an orientation selective wet etching process on the rectangular recess to shape the inner wall of the rectangular recess so as to cause the inner wall of the rectangular recess to be of a sigma shape.

2. The method according to claim 1, wherein the second material is silicon nitride.

3. The method according to claim 1, wherein the oxidation process comprises a wet oxidation process.

4. The method according to claim 1, wherein performing the orientation selective wet etching process on the recess includes using a tetramethylammonium hydroxide (TMAH) to shape the inner wall of the recess.

5. The method according to claim 4, wherein an etching rate of the orientation selective wet etching on a (100) crystal orientation plane is faster than the etching rate of the orientation selective wet etching on a (111) crystal orientation plane.

6. The method according to claim 1, wherein an etching rate of the orientation selective wet etching on a (100) crystal orientation plane is faster than the etching rate of the orientation selective wet etching on a (111) crystal orientation plane.

7. The method according to claim 6, wherein the orientation selective wet etching substantially stops on the (111) crystal orientation of plane.

8. The method according to claim 1, wherein the first material is polysilicon.

9. The method according to claim 1, further comprising:
performing an epitaxial growth of a SiGe in the sigma-shaped recess after the orientation selective wet etching process.

10. The method according to claim 9, further comprising:
performing an ion implantation process on the substrate to form a source region and a drain region after the epitaxial growth of the SiGe in the sigma-shaped recess.

11. The method according to claim 1, further comprising:
performing an ion implantation process on the substrate to form a source region and a drain region before changing the characteristic of the first portion of the substrate.

12. The method according to claim 1, wherein the substantially rectangular recess has a depth of about 300 Å to 500 Å before the orientation selective wet etching process is performed on the recess.

13. The method according to claim 1, further comprising:
before changing the characteristic of the first portion of the substrate: forming the mask overlaying an area to be formed as a NMOS device and exposing an area to be formed as a PMOS device.

* * * * *